United States Patent [19]

Masui et al.

[11] Patent Number: 4,675,867
[45] Date of Patent: Jun. 23, 1987

[54] DATA PROCESSING DEVICE

[75] Inventors: Toshiyuki Masui; Masahide Hirasawa, both of Kanagawa; Susumu Kozuki; Motokazu Kashida, both of Tokyo; Masahiro Takei, Kanagawa; Kenichi Nagasawa, Tokyo, all of Japan

[73] Assignee: Canon Kabushiki Kaisha, Tokyo, Japan

[21] Appl. No.: 680,299

[22] Filed: Dec. 11, 1984

[30] Foreign Application Priority Data

Dec. 14, 1983 [JP] Japan .................................. 58-235846
Dec. 14, 1983 [JP] Japan .................................. 58-235847
Dec. 14, 1983 [JP] Japan .................................. 58-235848
Dec. 14, 1983 [JP] Japan .................................. 58-235849
Dec. 14, 1983 [JP] Japan .................................. 58-235850
Dec. 14, 1983 [JP] Japan .................................. 58-235851

[51] Int. Cl.$^4$ .............................................. G06F 11/00
[52] U.S. Cl. ........................................... 371/31; 371/5
[58] Field of Search ................................. 371/5, 31, 65; 360/38.1; 358/314, 336

[56] References Cited

U.S. PATENT DOCUMENTS 3,496,528  2/1970  Brey .................................... 571/31 X
3,569,934  3/1971  Parr ..................................... 371/31
3,646,517  2/1972  Waters ............................... 371/5 X
4,054,863 10/1977  Goodman ......................... 371/31
4,380,069  4/1983  Reitmeier ......................... 371/31
4,519,001  5/1985  Morrison .......................... 371/31 X

FOREIGN PATENT DOCUMENTS 41050  3/1982  Japan ................................. 371/5

Primary Examiner—Jerry Smith
Assistant Examiner—Robert W. Beausoliel, Jr.
Attorney, Agent, or Firm—Toren, McGeady and Goldberg

[57] ABSTRACT

A data processing device for processing data including a first data sequence indicative of the amplitude of an information signal and a second data sequence each data of which indicates the error rate of each data of the first data sequence. When each data of the second data sequence continuously shows a high error rate of a consecutive number of data of the first data sequence more than a predetermined number, the device generates data of values which are $1/a^k$ (wherein "k" represents an integer between 1 and "n"; "a" a real number larger than 1; and "n" an integer at least 2) of a data of the first data sequence which has a low error rate and is located before or after the consecutive high error rate data of the first data sequence. The device performs data processing for muting the information signal by using these data.

22 Claims, 11 Drawing Figures

F I G. 7
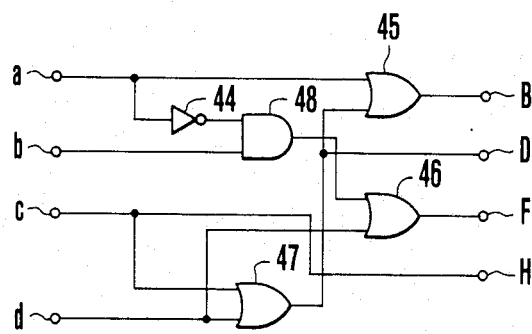

DATA PROCESSING DEVICE

BACKGROUND OF THE INVENTION

1. Field of the Invention:

This invention relates to a data processing device and more particularly to a device for processing data, which include a first data sequence indicative of the amplitude of an information signal and a second data sequence each data of which is indicative of the error rate of each data of the first data sequence.

2. Description of the Prior Art:

Digital signal reproducing apparatuses in general are sometimes prevented from accurately reproducing data by occurrences of noises produced in the data transmission line, a time crosstalk, a drop-out, etc. Generally, such noise is produced in a pulse like shape and is sometimes reproduced in an excessive degree depending on the part at which a data error is produced by the noise within a data sequence. In view of this, error correcting or error detecting codes, etc., are added to a data sequence to impart redundancy to the data sequence for the purpose of correcting an error in the recorded information by real time processing. Then, for correct data reproduction, preceding or previous value holding, intermediate value interpolation, etc., are sometimes carried out on the side of a reproducing apparatus to compensate for errors due to noises. However, there might take place such a large data drop-out that is unsuppressible by the above-stated error compensation arrangement heretofore employed against noises. In that event, a data which is produced in a sequential, time serial manner is quite likely to become erroneous. For example, in the event of such a large drop-out in the data of a digital signal obtained by pulse code modulation (PCM) of an audio signal, there will be produced an abnormal sound. Therefore, to solve this problem, it has been practiced to use, as necessary, the above-stated error detecting codes, error correcting codes, etc. for forming flag data which indicate the error rate of each data; and the output signal is muted by changing the output data into data corresponding to a zero level when the flag data come to consecutively show a high error rate over a long period.

However, in muting the output signal, if the output data is immediately changed to a data corresponding to the zero level, the muting action brings about a sudden change in amplitude. This is undesirable especially for an audio signal, in terms of auditory sensation. To prevent this, there is a method, in which the above-stated flag data are arranged to be counted for a predetermined period of time and to be attenuated by a plurality of attenuators according to a count value thus obtained, so that the muting action can be gradually performed. This method eliminates sudden amplitude changes of the output signal as muting is arranged to be accomplished by gradually attenuating the data and to be gradually undone. This method, however, requires extremely complex circuit arrangement and thus has been hardly applicable to houshold appliances which must be compact and not expensive.

SUMMARY OF THE INVENTION

It is a general object of this invention to provide a data processing device which is capable of eliminating the above-stated drawbacks of the prior art devices.

It is a more specific object of the invention to provide a data processing device which is capable of muting an information signal in a very satisfactory manner with simple arrangement.

It is another specific object of the invention to provide a data processing device which permits simplification of a data processing circuit arrangement required to gradually perform a muting action on an information signal to remove the unnaturalness of the signal and to gradually undo the muting action.

To attain this object, a data processing device which embodies an aspect of this invention and is arranged to handle data including a first data sequence indicative of the amplitude of an information signal and a second data sequence having each data thereof arranged to show the error rate of each data of the first data sequence, comprises: Detecting means which uses each data of the second data sequence for detecting that a number of data of the first data sequence more than a predetermined number consecutively have high error rates; generating means for generating, in response to the output of the detecting means, data of values which are $1/a^k$ (wherein "k" represents an integer between 1 and "n", "a" a real number larger than 1 and "n" an integer at least 2) of a data of the first data sequence which has a low error rate and is located before or after the consecutive high error rate data within the first data sequence; and muting means for muting the information signal by using data generated by the generating means.

These and further objects and features of the invention will become apparent from the following detailed description of preferred embodiments thereof taken in connection with the accompanying drawings.

BRIEF DESCRIPTION OF THE DRAWINGS

FIG. 7 is a circuit diagram showing, by way of example, the details of a control circuit shown in FIG. 5.

DETAILED DESCRIPTION OF THE PREFERRED EMBODIMENTS

Figure 1:
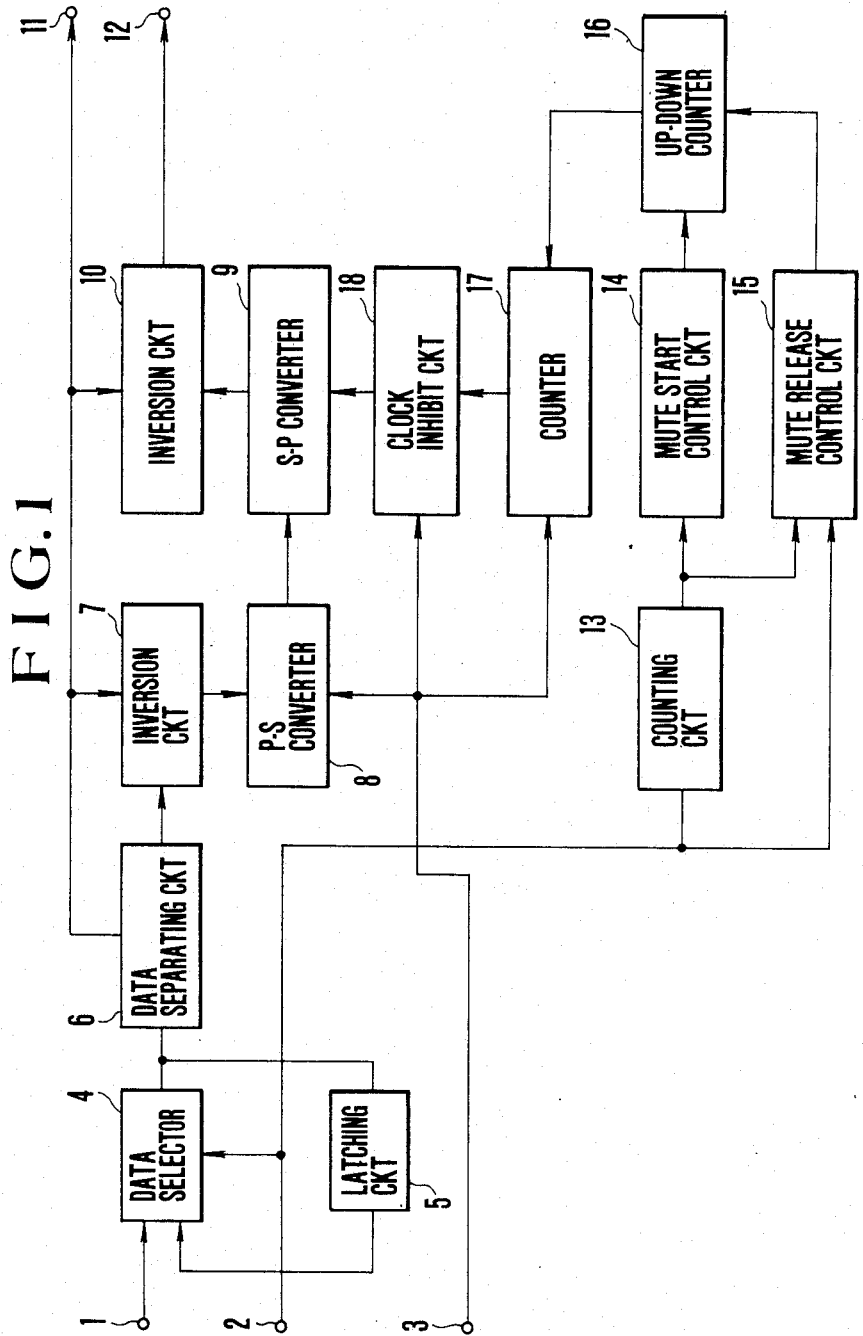
FIG. 1 is a block diagram showing the essential components of a data processing device arranged according to this invention as a preferred embodiment thereof.

Embodiments of this invention are described below with reference to the accompanying drawings to show the details of the invention:

FIG. 1 shows the essential components of a data processing device arranged as an embodiment of the invention. A terminal 1 is arranged to receive data of an "n" number of bits (hereinafter referred to as "n" bits) which are indicative of the amplitude of an information signal and are supplied one after another in a time serial manner. Another terminal 2 is arranged to receive flag data showing the error rates of the "n" bit data supplied to the terminal 1. A selector 4 is arranged to selectively produce either data produced from a latching circuit 5 or the data supplied to the terminal 1. This selector 4 is under the control of the flag data supplied to the terminal 2. Assuming that the flag data obtained when the error rate of the "n" bit data is high are expressed as to be at "1" and the flag data obtained when the error rate is low are expressed as to be at "0", the selector 4 produces the "n" bit data obtained from the latching circuit 5 when the flag data are at "1" and produces the "n" bit data obtained from the terminal 1 when the flag data are at "0".

Let us assume that the "n" bit data which represent the amplitude of an information signal are so-called linear 2's complement data. In other words, all the bits are 0 when the amplitude is 0. The most significant bit (hereinafter referred to as MSB bit) is at "0" while the rest of bits are at "1" when the amplitude is $(+2^n-1)$. The MSB bit is at "1" and the rest of bits at "0" when the amplitude is $(-2^n)$. All the bits are at "1" when the amplitude is $(-1)$. A data separating circuit 6 is arranged to separate the MSB bit data from the rest of bit data $(n-1)$.

An inversion circuit 7 is arranged to invert the bit data $(n-1)$ by taking the complement of 1 when the MSB bit is 1 and thus makes the $(n-1)$ bit data into $(n-1)$ bit data which correspond to the absolute value of the amplitude. A parallel-to-series converter 8 (hereinafter referred to as P-S converter) is arranged to parallel-to-series (P-S) convert the $(n-1)$ bit data produced from the inversion circuit 8. The converter 8 serially produces the $(n-1)$ bit data which are received in parallel by producing them starting with the least significant bit (hereinafter referred to as LSB bit) thereof. A series-to-parallel converter 9 (hereinafter referred to as S-P converter) is arranged to series-to-parallel (S-P) convert the $(n-1)$ bit data produced from the P-S converter 8.

Figure 2:
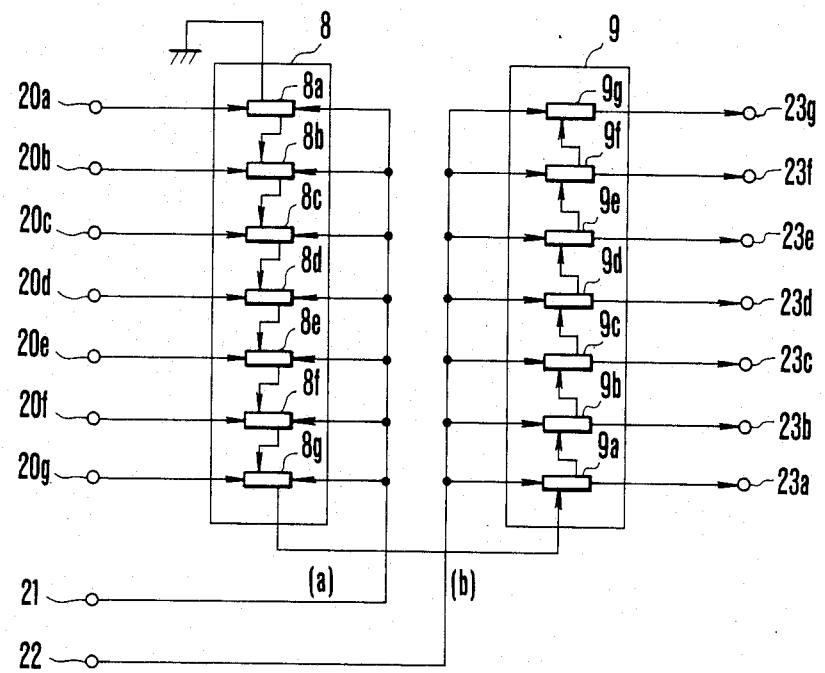
FIG. 2 is a diagram showing the operation of a parallel-to-serial converter and that of a serial-to-parrallel converter.
Figure 3:
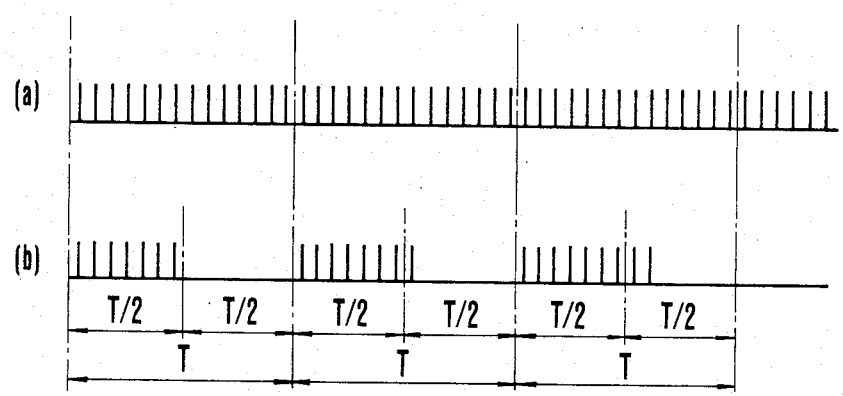
FIG. 3 is a timing chart showing the operating clock arrangement of the parallel-to-serial converter and that of the serial-to-parallel converter.

The operation of the P-S and S-P converters 8 and 9 is as shown in FIG. 2. Operating clock pulses are supplied to these converters 8 and 9 as shown in FIG. 3 in a timing chart. In FIGS. 2 and 3, the data representing the amplitude of the information signal are assumed to be of 8 bits while the data which are P-S and S-P converted are assumed to be of 7 bits. Clock pulses are supplied to a terminal 3 of FIG. 1. During each "n" bit data sampling period T (see FIG. 3), $2(n-1)$ clock pulses are generated. Referring to FIG. 2, while data supplied via terminals 20a–20g are held at registers 8a–8g of the P-S converter 8, when the data are shifted by applying the $(n-1)$ clock pulses (seven pulses) at the same timing, the data held at these registers 8a–8g are transferred to registers 9a–9g. Further, at that time, a data of "0" is supplied to the input side of the register 8a to set all the registers 8a–8g at "0".

Then, when a number "k" of clock pulses are applied further to the S-P converter 9, the data of the registers 9a–9g are further shifted "k" times. The register 9g has the LSB bit of the $(n-1)$ bit data produced from the terminals 23a–23g. Therefore, the shifting operation which is performed "k" times causes the $(n-1)$ bit data to be shifted down "k" times. As a result of this, the data become about $1/2^k$ of the original data. All the data then become "0" in the case of $k=n-1$. Therefore, by supplying a minimum $(n-1)$ and a maximum $2(n-1)$ clock pulses to the S-P converter 9 within each of "n" bit data sampling periods, data of values which are about $\frac{1}{2}^k$, wherein "k" represents an integer above 0 and below $(n-1)$, of the original data can be obtained. Since it suffices to have a number of clock pulses more than $(n-1)$ are arranged to be supplied to the P-S converter 8, in this specific embodiment, always $2(n-1)$ clock pulses are supplied within each sampling period.

Meanwhile, the flag data received at the terminal 2 are supplied to a counting circuit 13. The counting circuit 13 counts the flag data when they are at "1" and is reset when the flag data become "0". However, in the event that the flag data are at "1" for a number of consecutive sampling periods more than a number l, the count value counted by the counting circuit stops at a value l. A mute start control circuit 14 is arranged to produce a total of $(n-1)$ pulses, one at every period T after the counting operation of the counting circuit 13 comes to a stop. An up-down counter 16 is arranged to count upward in response to the output of the circuit 14. A mute release circuit 15 begins to operate upon receipt of a flag data of "0" after commencement of muting and then comes to produce one pulse for every period T. This output of the circuit 15 causes the up-down counter 16 to count down.

Assuming that the output of this up-down counter 16 is "k", a counter 17 counts the clock pulses and causes a clock inhibit circuit 18 to operate when the number of the clock pulses reaches $(n-1+k)$ within each of the periods T. In other words, during each period T, the remaining number $(n-1-k)$ of clock pulses are inhibited from being supplied to the S-P converter 9.

Figure 4:
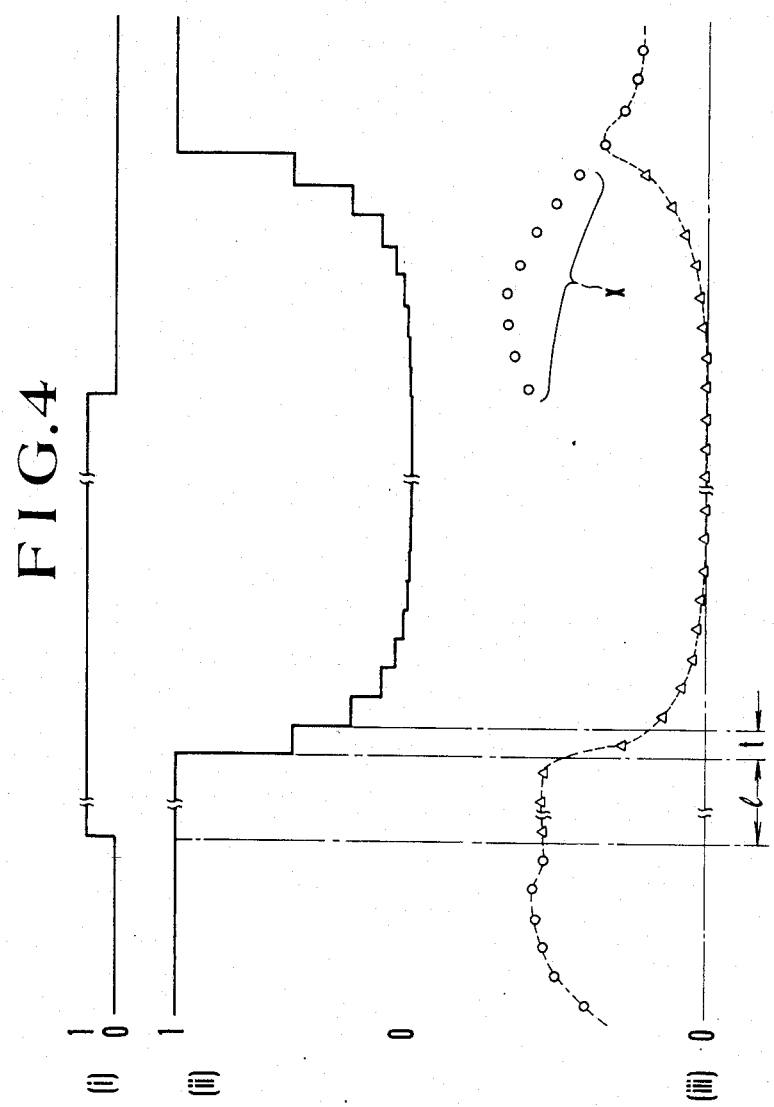
FIG. 4 is a chart showing a muting process performed by the device of FIG. 1.

FIG. 4 shows muting process performed by the device arranged as shown in FIG. 1. Referring to FIG. 4, the illustration includes flag data (i), control levels (ii) and output data (iii). During a period 1T after the flag data change to "1" and before counting by the counting circuit 13 comes to a stop, the output data are produced at a value which is previously obtained and held at the latching circuit 5. When the counting operation of the counting circuit 13 comes to a stop, the number of clock pulses supplied to the S-P converter 9 during the period T becomes $(n-1+k)$. Then, the data are produced one after another at values which are $\frac{1}{2}^k$ (wherein "k"=1, 2, 3, ---, $(n-1)$), of the data which is held at a previous value until completion of muting. Then, the level of the output data becomes zero.

Following this, when the flag data come back to "0", the number of clock pulses within the period T gradually decreases one by one from $2(n-1)$ to $(n-1)$. Then, the data are produced one after another at values which are $\frac{1}{2}k$ (wherein "k"=$(n-1)$, $(n-2)$, ---, 2, 1) of the $(n-1)$ bit data supplied to the P-S converter 8 until muting is completely undone. Then, the "n" bit data received at the terminal 1 come to be produced as they are from terminals 11 and 12. During this muting release period, the output data are produced at values $\frac{1}{2}^k$ of the low error rate data which are received at the terminal 1 and indicated by a reference symbol "x" in FIG. 4. In FIG. 4, marks "o" indicate low error rate data and marks "Δ" substituted data.

With the data processing circuit arranged as described above, the muting process is performed by producing one after another the values which are $\frac{1}{2}, \frac{1}{2}^2, ---, \frac{1}{2}^k$ of the data held at the previous value. Therefore, the muting process can be accomplished in a satisfactory manner without causing any sudden change in amplitude. Besides, the circuit arrangement is very simple and easily practicable.

Further, with the muting process arranged to be undone in the manner as described above, no sudden change takes place in amplitude also during the release of muting. Since the muting process and the muting release process can be carried out with very simple circuit arrangement, the embodiment of the invention is highly advantageous for applications even to household recording/reproducing apparatuses.

In the specific embodiment described above, the number of shifts within the period T is increased and decreased by one at a time to obtain the $\frac{1}{2}, \frac{1}{2}^2, ---$ and $\frac{1}{2}^{k-1}$ values and the $\frac{1}{2}^{k-1}, ---, \frac{1}{2}^2$ and $\frac{1}{2}$ gains are obtained. However, it is also possible to obtain $\frac{1}{4}, \frac{1}{4}^2, ---$ and $\frac{1}{4}^{k-1}$ values and $\frac{1}{4}^{k-1}, \frac{1}{4}^{k-2}, ---, \frac{1}{4}^2$ and $\frac{1}{4}$ gains by increasing and decreasing by two at a time the number of shifts within the period T. In another possible modification of the embodiment, the P-S and S-P converters may be arranged in two pairs. Then, $\frac{3}{4}, (\frac{3}{4})^2, ---$ and $(\frac{3}{4})^{k-1}$ values and $(\frac{3}{4})^{k-1}, (\frac{3}{4})^{k-2}, ---, (\frac{3}{4})^2$ and $\frac{3}{4}$ gains are obtainable.

The data processing device arranged according to the invention as described in the foregoing is capable of gradually muting the data representing amplitude and gradually undoing the muting action by just changing the number of control clock pulses applied to the S-P and P-S converters. Therefore, the embodiment is quite easily practicable with very simple circuit arrangement.

Figure 5:
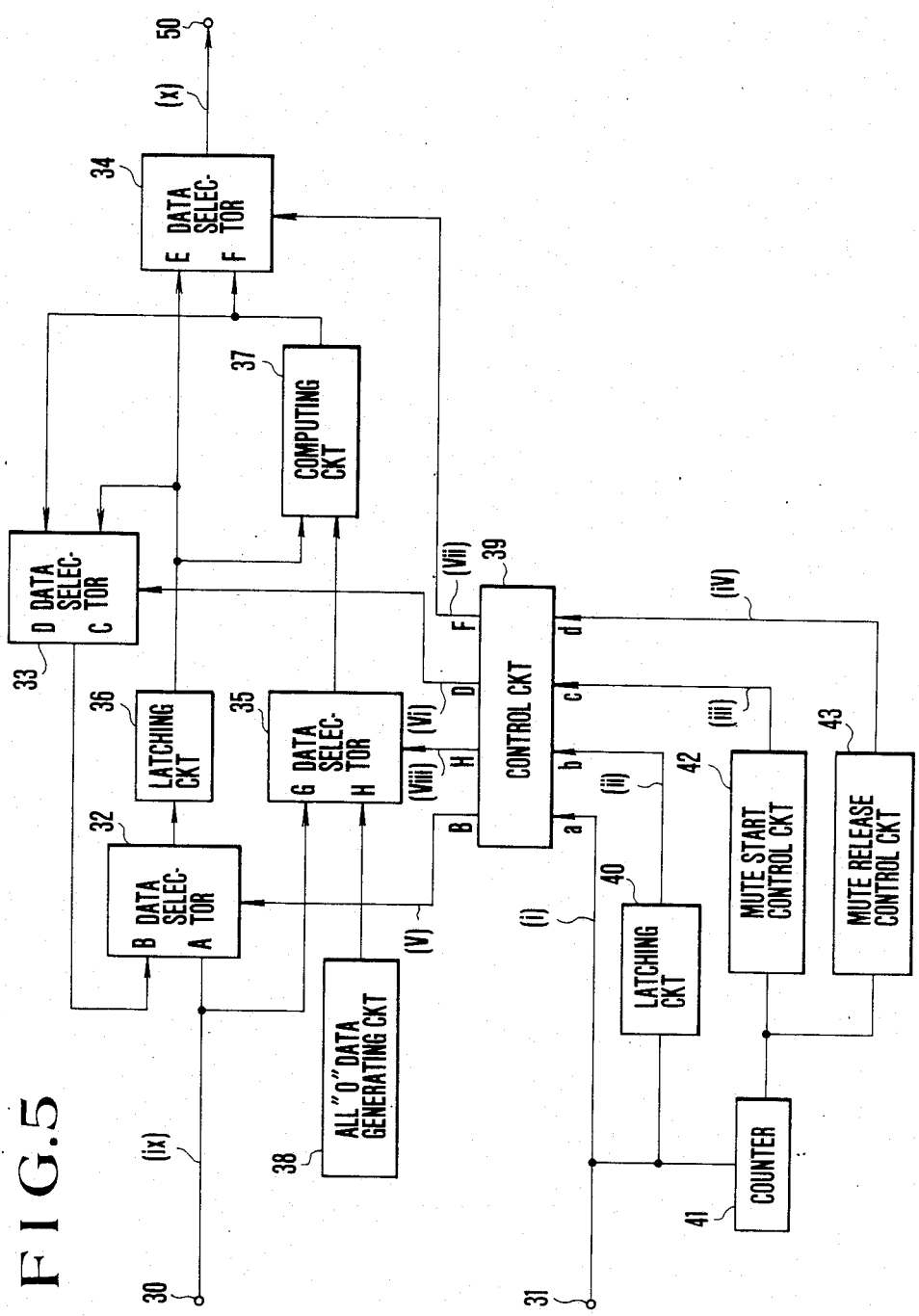
FIG. 5 is a block diagram showing the essential components of a data processing device arranged according to the invention as another embodiment thereof.

FIG. 5 shows the essential parts of a data processing device arranged as another embodiment of the invention. A terminal 30 is arranged to receive data of "n" bits which are indicative of the amplitude of an information signal and are supplied one after another in a time serial manner to the terminal 30. A terminal 31 is arranged to receive flag data indicative of the error rate of the "n" bit data supplied to the terminal 30. The data processing device comprises data selectors 32, 33, 34 and 35; a latching circuit 36 which is arranged to hold the output of the selector 32 over one sampling period for the "n" bit data; a computing circuit 37 which is arranged to compute and produce a data showing the average value of the data produced from the latching circuit 36 and the data produced from the data selector 35; a circuit 38 arranged to generate data which are all at "0"; and a control circuit 39 which controls the data selectors 32, 33, 34 and 35.

A latching circuit 40 is arranged to hold the flag data supplied to the terminal 31 for one sampling period T of the "n" bit data and to supply the flag data to the control circuit 39. A counter 41 is arranged to count the flag data when they are at "1" and to be reset when they are at "0". As mentioned in the foregoing, the flag data are at "1" when the corresponding "n" bit data have a high error rate and at "0" when the corresponding "n" bit data have a low error rate. A mute start control circuit 42 is arranged to produce an output "1" when the counted value of the counter 41 is above a value l1 and below a value (l1 +l2). A mute release control circuit 43 is arranged to produce an output "1" for a period l2T when the counter 41 is reset after its counted value becomes the value l1. These values l1 and l2 are integers larger than 1. Assuming that l1=31 and l2=8, for example, a binary counter may be advantageously used as the counter 41.

Figure 6:
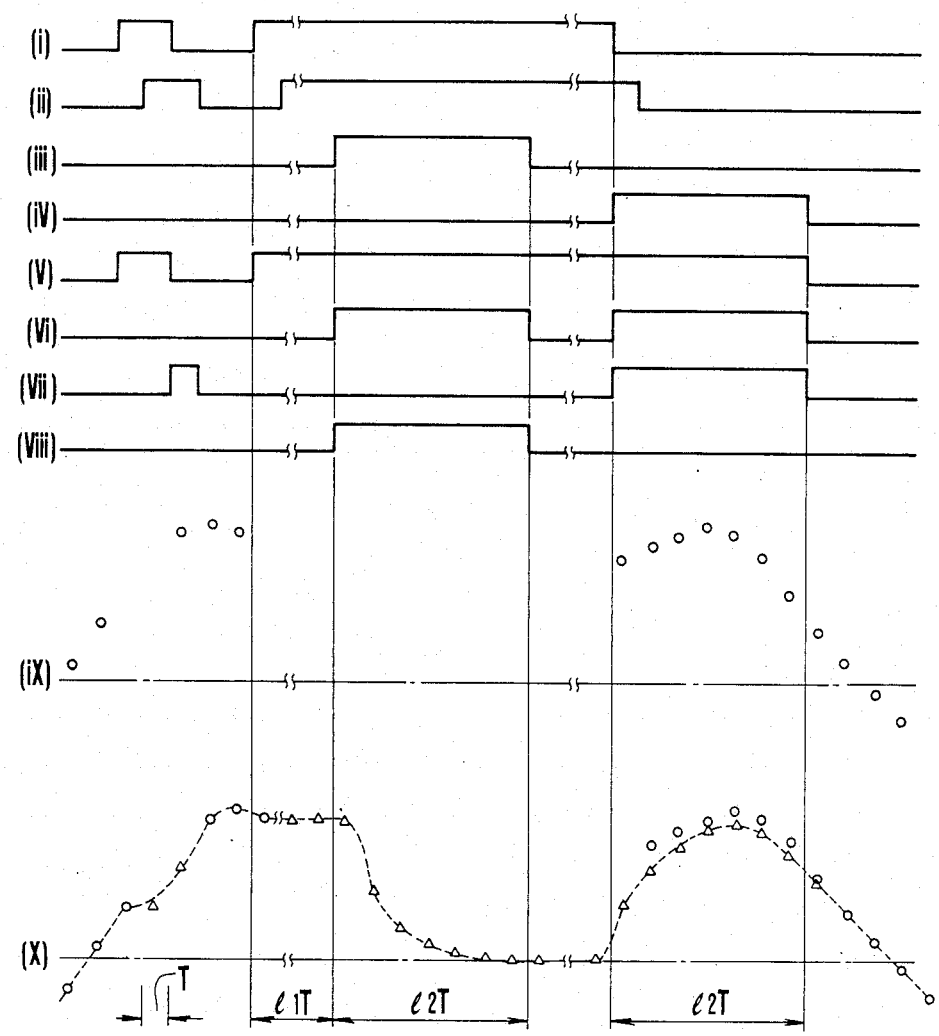
FIG. 6 is a timing chart showing the waveforms of various parts of FIG. 5.

FIG. 6 is a timing chart showing the waveforms of parts (i)-(x) which are shown in FIG. 5. Meanwhile, Table 1, which is given below, shows the relation of input signals a, b, c and d of the control circuit 39 to output signals B, D, F and H of the control circuit. When the output signals B, D, F and H of the control circuit 39 are respectively at "1", the data selectors 32, 33, 34 and 35 respectively select the data supplied to the terminals B, D, F and H of them as shown in FIG. 5. Table 1 shows all conceivable combinations of input signals to the control circuit 39.

TABLE 1

| Input signals | | | | Output signals | | | |
|---|---|---|---|---|---|---|---|
| a | b | c | d | B | D | F | H |
| 0 | 0 | 0 | 0 | 0 | 0 | 0 | 0 |
| 1 | 0 | 0 | 0 | 1 | 0 | 0 | 0 |
| 1 | 1 | 0 | 0 | 1 | 0 | 0 | 0 |
| 0 | 1 | 0 | 0 | 0 | 0 | 1 | 0 |
| 1 | 1 | 1 | 0 | 1 | 1 | 0 | 1 |
| 0 | 1 | 0 | 1 | 1 | 1 | 1 | 0 |
| 0 | 0 | 0 | 1 | 1 | 1 | 1 | 0 |

FIG. 7 is a circuit diagram showing, by way of example, the details of the control circuit 39 which gives the above-stated input-to-output signal relation. Further, in FIG. 6, marks "o" indicate low error rate data and marks "Δ" substituted data.

Referring now to FIG. 6 and Table 1, the embodiment operates as follows:

Let us first consider a case where a number of "n" bit data less than a number l1 having error rate are supplied to the terminal 1. In this case, the data selector 32 selects 37 "n" bit data supplied to the terminal B thereof while the data selector 33 selects "n" bit data supplied to the terminal C thereof. As a result of this, the data selector 32 comes to produce data which are delayed for one period T at the latching circuit 36. The data selector 34 produces data supplied to the terminal E thereof. Therefore, an output terminal 50 of the data processing device produces again the same data that have been produced one period T before. However, the device is normally arranged to always produce data obtained one period T before even in producing low error rate data. Therefore, in the event that the "n" bit data supplied to the terminal 30 come to have a high error rate, low error rate data which is received one period T before and held at the latching circuit 36 is produced. Then, during the next period T, data received two periods T before and again held at the latching circuit 36 are produced.

When the "n" bit data supplied to the input terminal 30 come to have a low error rate within one period T, the data selector 32 selects data supplied to the terminal A thereof while the data selector 34 selects data produced from the computing circuit 37. The output data of the computing circuit 37 have an intermediate value between low error rate data produced during the next period T and the data held. Thus, the so-called intermediate value interpolation is accomplished.

The muting operation of the embodiment is as follows: During a period of commencement of muting, i.e. when the output of the mute start control circuit 42 is at "1", the data selector 35 supplies the computing circuit 37 with data which are all at "0". Then, the computing circuit 37 obtains data of the average value of the all "0" data and the data which are held at the previous value. In other words, a data of a value which is $\frac{1}{2}$ of the data held at the previous value is produced from the computing circuit 37. The data which is thus produced is supplied through the data selectors 33 and 32 to the latching circuit 36 to be held there. The data thus held at the latching circuit 36 are produced via the terminal E of the data selector 34 during the next period T. The data thus produced are again supplied to the computing circuit 37 to obtain an average value between the data and the all "0" data. The computing circuit this time produces data at a value which is about $\frac{1}{2}^2$ of the data held at the previous value. Then, during the next period T, the value of the data produced from the device becomes also about $\frac{1}{2}^2$ of the data held at the previous value. In this manner, the value of the data produced from the device one after another thus becomes $\frac{1}{2}^3$, $\frac{1}{2}^4$, ---, and $\frac{1}{2}^n$ of the data held at the previous value. In the case of data of 8 bits, the data becomes "0" at n=8 (=12).

At the time of undoing or release of the muting action, the embodiment operates as follows: When the output (iv) of the mute release control circuit 43 is at "1", the computing circuit 37 computes an intermediate value between the value of low error rate data received at the terminal 30 and that of the data produced from the latching circuit 36, i.e. the all "0" data. The intermediate value data thus obtained is produced via the terminal F of the data selector 34. Meanwhile, the output data of the computing circuit 37 is again supplied to the latching circuit 36 via the data selectors 33 and 32. During a next period T, an intermediate value between the above-stated intermediate value data and low error rate data received at the terminal 31 is produced. During a further subsequent period T, an intermediate value between the data produced immediately before and the low error rate data received at the terminal 31 is produced. With these processes repeated, the output of the device gradually comes closer to the signal, waveform of the low error rate data to have the muting action smoothly undone unless the data are of exceptionally large amplitude.

Despite the simple circuit arrangement, the embodiment is capable of carrying out muting satisfactorily without incurring any sudden amplitude change as it is arranged to perform a muting action by gradually producing data of values $\frac{1}{2}$, $\frac{1}{2}^2$, --- and $\frac{1}{2}^k$ of the data held at the previous value in the same manner as in the case of the preceding embodiment described in the foregoing.

In accordance with the arrangement of the embodiment described, at the start of a muting action, an average value between the all "0" data and the data produced immediately before indicating the signal amplitude is repeatedly computed and produced. It is another advantage of the embodiment that the circuit arrangement of the embodiment permits utilization of the conventional previous value holding and intermediate value interpolating circuits without much modification. Therefore, the embodiment can be very easily arranged in a small scale.

In the arrangement described above, the computing circuit 37 is arranged to produce the data averaging the output of the latching circuit 36 and the output of the data selector 35. However, in the event of an excessively large amplitude change at commencement of the muting action, the above-stated arrangement may be changed to have the output of the latching circuit 36 mixed with that of the data selector 35 in the ratio of 2 to 1 of the latter. In other words, generally speaking, at the beginning of muting, the computing circuit 37 is arranged to produce data of values 1/a (wherein "a" represents a real number larger than 1) of the output of the latching circuit 36. In this instance, the output of the computing circuit 36 gradually changes as follows: 1/a, $1/a^2$, --- and $1/a^n$. However, in this instance, the value l2 which is mentioned in the foregoing preferably decreases according as the value of "a" increases and increases according as the value "a" decreases.

While the immediately preceding data is repeatedly averaged with the all "0" data in the case of the embodiment described above, the former may be averaged with some other predetermined tata. This modification is advantageous in case where, for example, data of some error rate that does not require muting are supplied for several consecutive time. For example, in a circuit system arranged to always produce data received one period T before the output, the value of the previous value holding process is discernible. In that case, the unnaturalness of a signal resulting from the previous value holding process can be eliminated by repeatedly (several times) averaging the data which is obtained immediately before the previous value holding process and the data which is used for the previous value holding process and held as a predetermined data.

Figure 8:
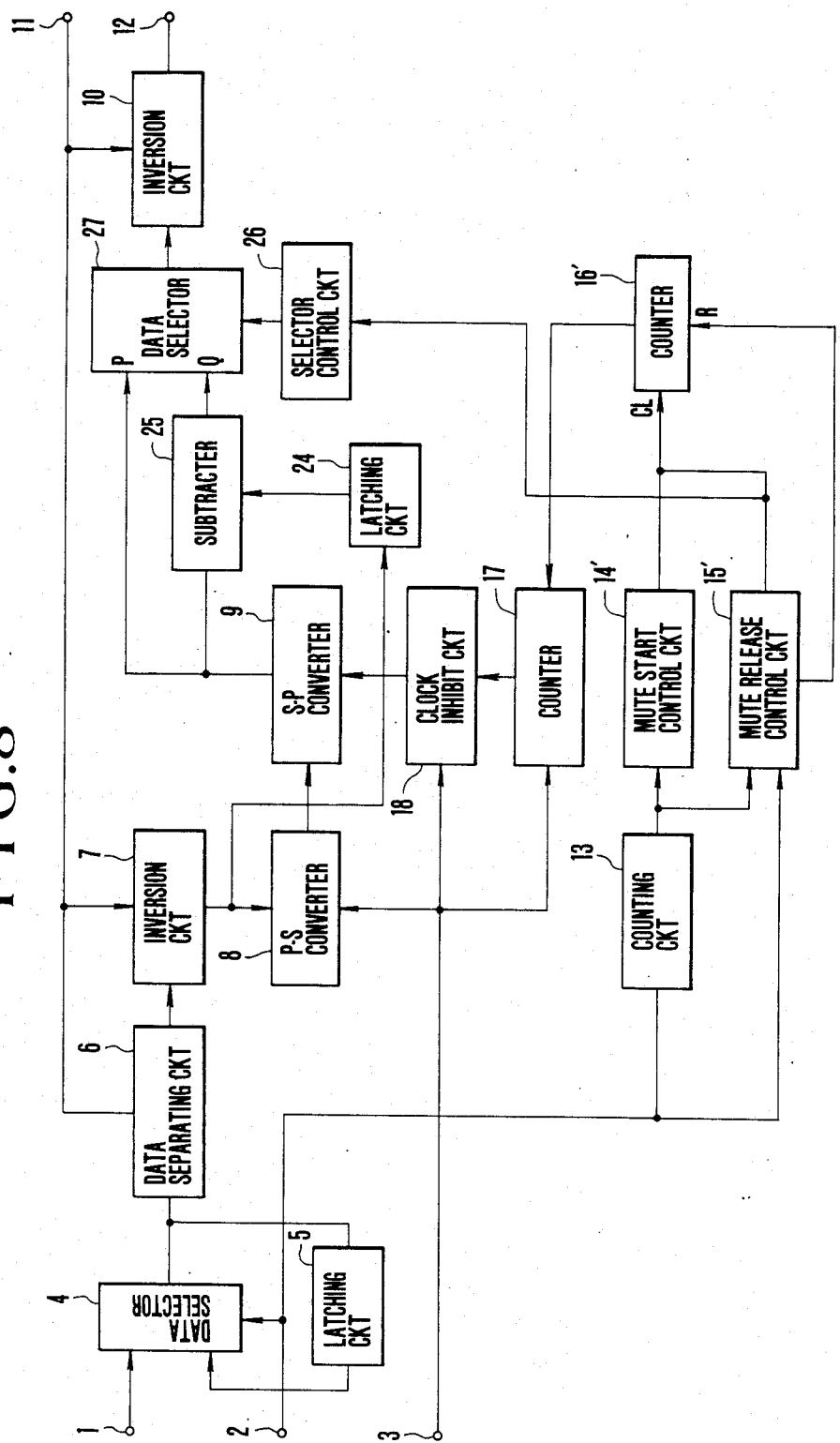
FIG. 8 is a block diagram showing the essential components of a data processing device arranged according to the invention as a further embodiment thereof.

FIG. 8 shows the essential components of a data processing device arranged as a further embodiment of the invention. The same components as those shown in FIG. 1 are indicated by the same reference numerals and details of them are omitted from the following description. A counting circuit 13 is arranged to count the flag data which are at "1" in the same manner as in the preceding embodiment. In this case, however, the count value stops at a value l when a number of flag data more than a number l are consecutively at "1" during a sampling period. A mute start control circuit 14' is arranged to produce one pulse at every period T after the counting operation of the counting circuit 13 comes to a stop and to produce a total of (n−1) pulses, which are supplied to the clock input terminal of a counter 16'. In response to the pulses produced from the circuit 14', the counter 16' counts the pulses one by one up to (n−1) and keeps its counted value at that value. A mute release control circuit 15' is arranged to begin to produce one pulse at every period T when the flag data become '0" after commencement of muting and to produce a total of (n−1) pulses. These pulses are supplied to the clock input terminal of the same counter 16'. In addition to that, the mute release control circuit 15' also produces reset pulses to reset the counter 16' when the flag data changes from "1" to "0" and when the period T lapses after it supplies the (n−1)th pulse to the clock input terminal of the counter 16'. Assuming that the output of this counter 16' is "k", another counter 17 counts the clock pulses and renders a clock inhibiting circuit 18 operative when the counted number of pulses reaches (n−1+k) during every period T. In other words, at that instant during each period T, the clock inhibiting circuit 18 inhibits the remaining (n−1−k) clock pulses from being supplied to the S-P converter 9.

Figure 9:
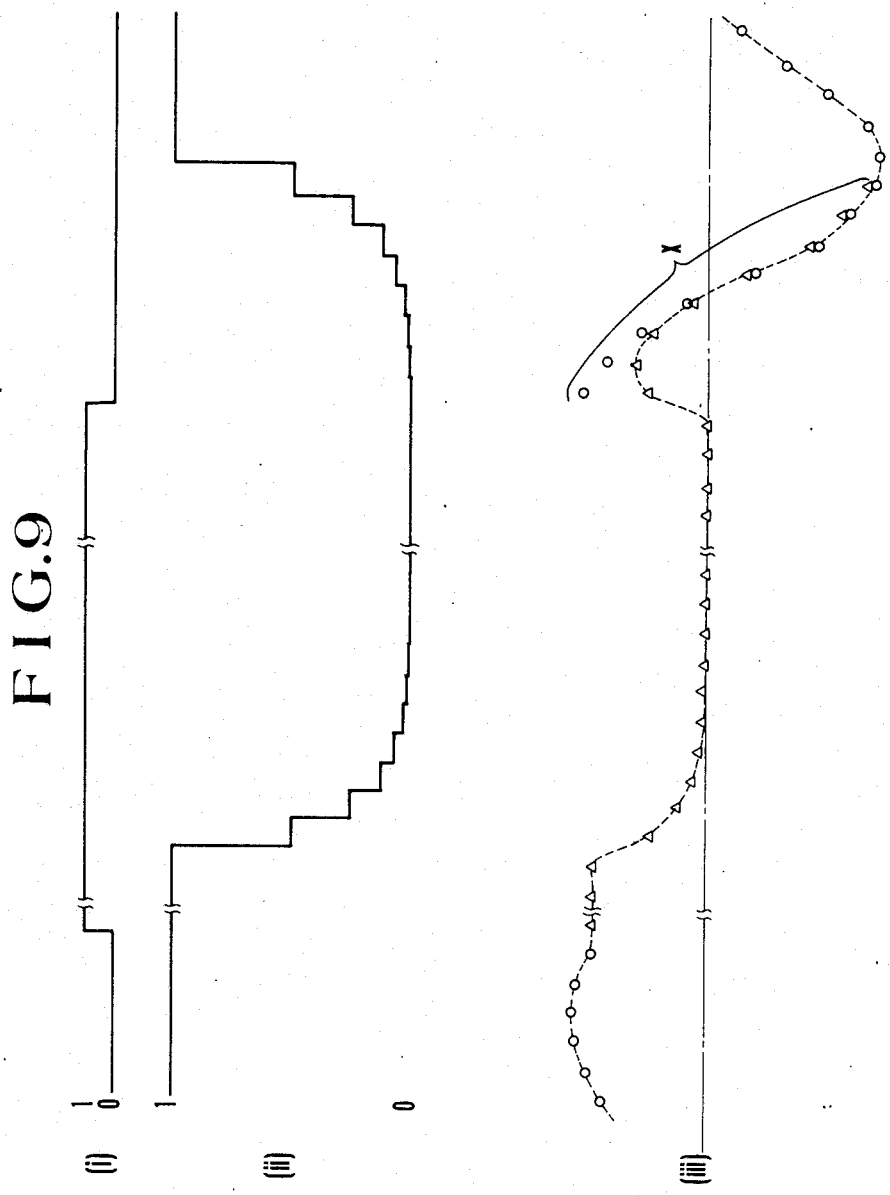
FIG. 9 is a chart showing a muting process performed by the device of FIG. 8.

The embodiment which is arranged as shown in FIG. 8 performs muting as shown in FIG. 9. Referring to FIG. 9, the illustration includes flag data (i), control levels (ii) and output data (iii). As shown, the data which are held at the previous value by the latching circuit 5 are produced as they are as output data during a period 1T after the flag data changes to "1", that is, before the counting circuit 13 stops counting. With the count by the counting circuit 13 coming to a stop, the number of clock pulses supplied to the S-P converter during the period T reaches $(n-1+k)$. Then, data of values $V\frac{1}{2}^k$ ("k" being 1, 2, 3, --- and $(n-1)$) of the absolute value of data held at the previous value are produced one after another from the S-P converter 9. A selector control circuit 26 is arranged to produce an output at "1" during a period during which pulses are produced from the mute release control circuit 15'. This circuit 26 is, for example, composed of a monostable multivibrator or the like. A data selector 27 is arranged to produce data received at its input terminal Q when the output of the selector control circuit 26 is at "1" and to produce data received at another input terminal P when the output of the circuit 26 is at "0". Accordingly, at the time of starting a muting action, the output of the S-P converter 9 is always supplied as it is to an inversion circuit 10. Therefore, data of values $\frac{1}{2}$, $\frac{1}{2}^2$, --- and $\frac{1}{2}^{n-1}$ of the previous value holding data are produced one after another from an output terminal 12. The muting action is accomplished in this manner and the level of the output data becomes zero.

Following that, when the flag data come back to "0", the number of clock pulses within each period T increases from $(n-1)$ to $2(n-1)$. Then, the output data of values which are $\frac{1}{2}^k$, "k" being 1, 2, 3, --- and $(n-1)$, of the $(n-1)$ bit data supplied to the P-S converter 8 are again produced one after another from the S-P converter 9. At this point of time, the output of the selector control circuit 26 is at "1". Therefore, the data selector 27 produces the output of a subtracter 25 which is supplied to the input terminal Q of the selector 27. This subtracter 25 is arranged to subtract the output of the S-P converter 9 from the output of the latching circuit 24 which is arranged to latch the data supplied to the P-S converter 8 over a sampling period. Therefore, the signal is released from the muting action as the data of values $1-\frac{1}{2}$, $1-\frac{1}{2}^2$, ---, $1-\frac{1}{2}^{n-2}$ and $1-\frac{1}{2}^{n-1}$ of the low error rate data received at the input terminal 1 (indicated by "x" in FIG. 9) are produced from the output terminal 12. In FIG. 9, marks "o" indicate low error rate data and marks "Δ" substituted data.

In the embodiment described above, the muting action is arranged to be undone by producing data of values which are $1-\frac{1}{2}$, $1-\frac{1}{2}^2$, --- and $1-\frac{1}{2}^{k-1}$ of the low error rate data. However, the muting release period may be changed by changing the clock pulse increasing period in such a way as $-\frac{1}{2}$, $-\frac{1}{2}^2$, --- and $1-\frac{1}{2}^{k-1}$ or $1-\frac{1}{2}$, $1-\frac{1}{2}$, $1-\frac{1}{2}^2$, $1-\frac{1}{2}^2$, ---, $1-\frac{1}{2}^k$ and $1-\frac{1}{2}^k$.

In another modification of the embodiment, for example, two S-P converters are arranged to obtain data of values representing the sum of $\frac{1}{4}^k$ and $\frac{1}{2}^k$ and these values are subtracted from data which are all at "1". With this arrangement, it is possible to have data of values of $1-\frac{3}{4}$, $1-(\frac{3}{4})^2$, ---, $1-(\frac{3}{4})^{k-2}$ and $1-(\frac{3}{4})$ produced from the device. More generally stated, the same advantageous effect is attainable for releasing or undoing a muting action by producing one after another the data of values of $1-1/a$, $1-1/a^2$, ---, $1-1/a^{n-2}$ and $1-1/a^{n-1}$, wherein "a" represents a real number larger than 1.

Figure 10:
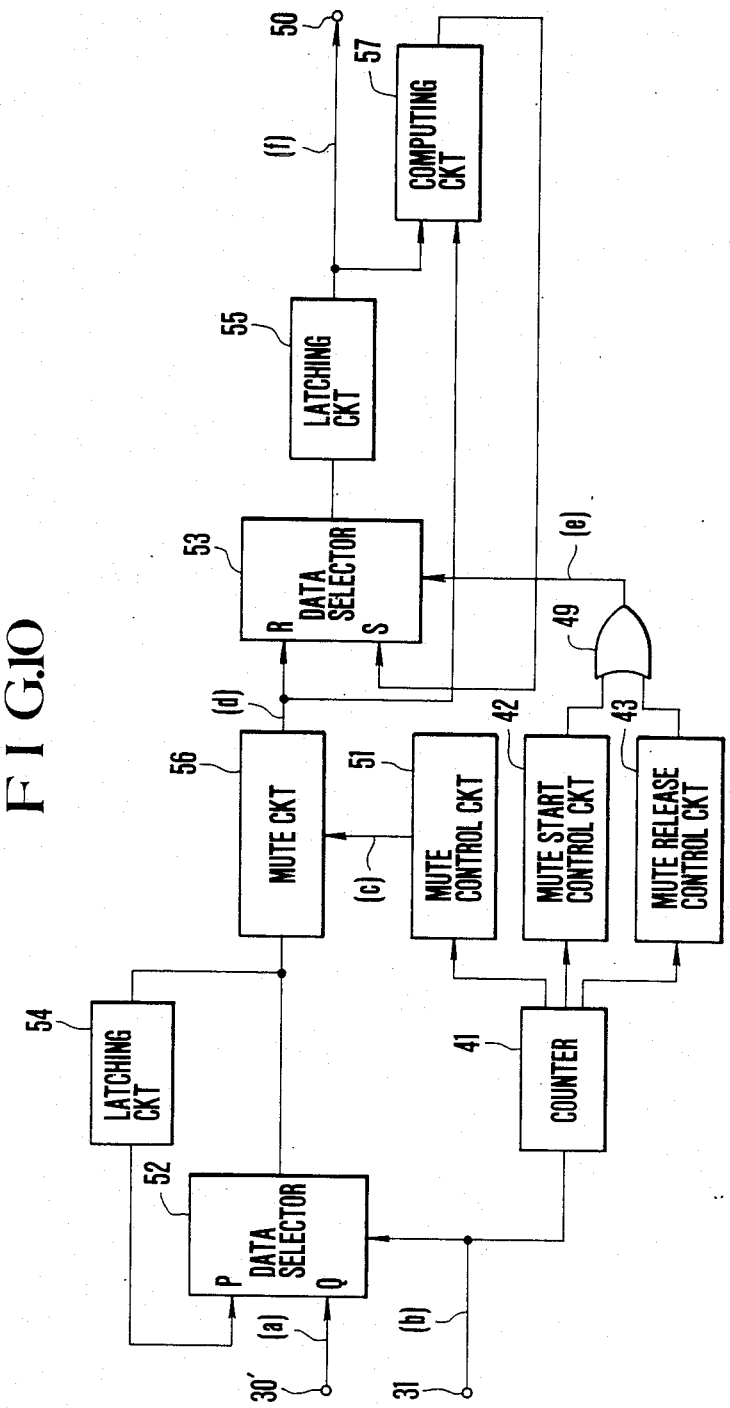
FIG. 10 is a block diagram showing the essential components of a data processing device arranged according to the invention as a still further embodiment thereof.

FIG. 10 shows the essential components of a data processing device arranged as a still further embodiment of the invention. The same components as those shown in FIG. 5 are indicated by the same reference numerals. An input terminal 30' is arranged to receive data indicative of the amplitude of an information signal. The embodiment is provided with an OR gate 49; a mute control circuit 51; data selectors 52 and 53; latching circuits 54 and 55; a mute circuit 56; and a computing circuit 57.

Figure 11:
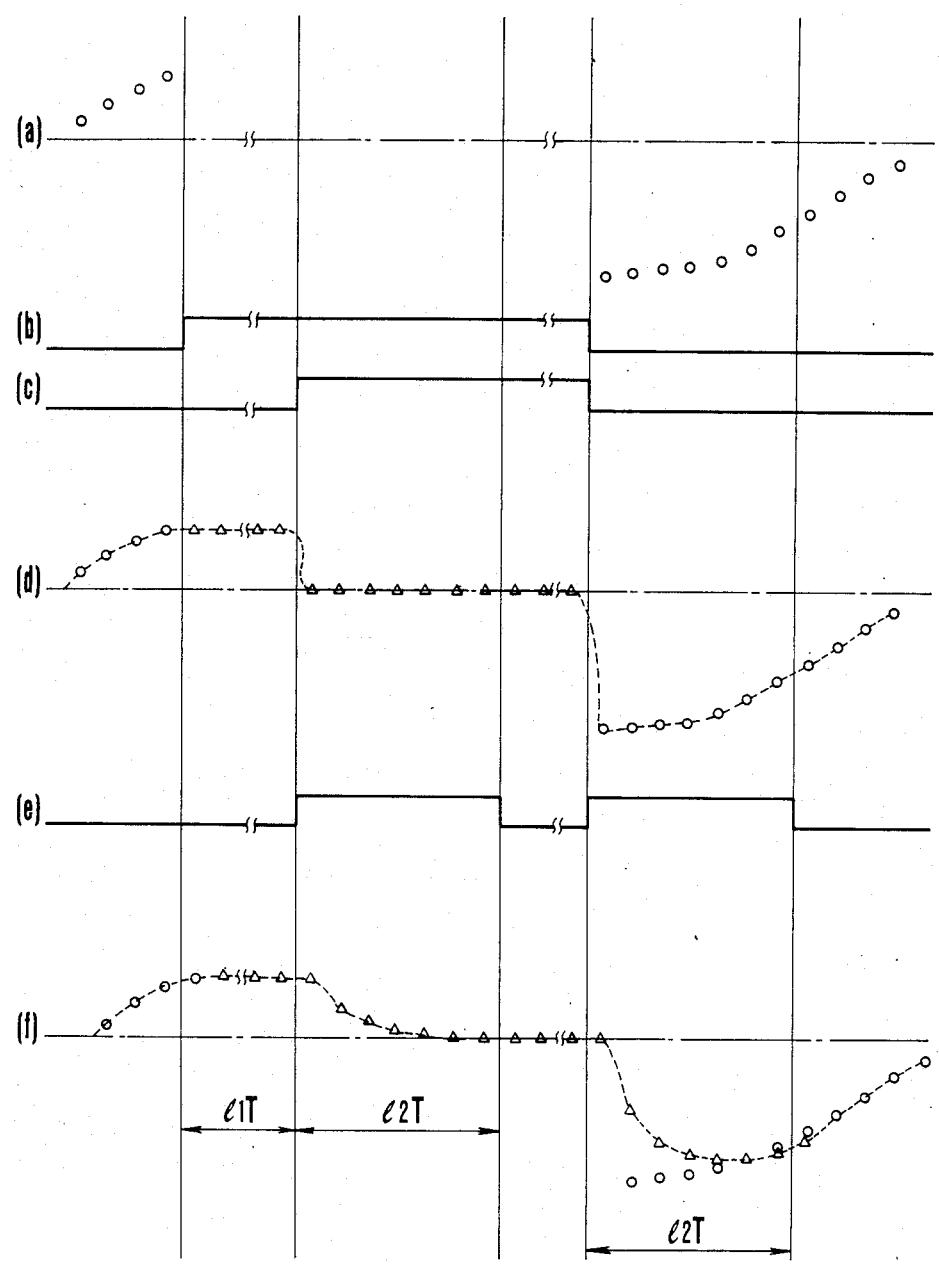
FIG. 11 is a timing chart showing the waveforms of the various parts of FIG. 10.

FIG. 11 is a waveforms chart showing the waveforms at various points (a)-(f) which are shown in FIG. 10 The operation of this embodiment will be described with reference to FIG. 11. First, let us describe the conventional method for obtaining the output (d) of the mute circuit 56. The data selector 52 is controlled by flag data (b) which are supplied to a terminal 31. When the flag data are at "1" indicating that the data supplied to the terminal 30' are at a high error rate, the data selector 52 produces data supplied to the terminal P thereof. The data supplied to the terminal P are data which have been produced from the selector 52 during an immediately preceding sampling period T and subjected to a previous value holding action performed by the latching circuit 54. The mute control circuit 51 produces an output at "1" when the counted value of a counter 41 exceeds a value 11. This output of the circuit 51 renders the mute circuit 56 operative. During the operation of the mute circuit 56, all data are muted. The signal waveforms of the data thus produced is as shown at (d) om FIG. 11. The signal waveforms shown at (d) of FIG. 11 is formed by the data representing the amplitude of the information signal. Meanwhile, flag data are supplied to the terminal 31. The data shown at (d) of FIG. 11 show salient changes in the amplitude which take place before and after muting by the mute circuit 56. Whereas, in this embodiment, the output of the OR gate 49 then changes to "1" only during a period 12T after the start of muting and another period 12T after the end of muting. The data selector 53 is arranged to produce data received at its terminal S only when the output of the OR gate 49 is at "1". The output of the data selector 53 produced at that time is data obtained from the computing circuit 57 by computing or, for example, averaging the data which have been produced from the selector 53 during an immediately preceding period T and the output (d) of the mute circuit 56. Therefore, as shown at (f) in FIG. 11, the data selector 53 gives an output which never brings about any large amplitude change. The same result is obtainable with the output of the data selector 53 arranged to be produced as it is from a terminal 50.

In accordance with the arrangement of data processing device described above, the data indicative of signal amplitude and the data produced immediately before are repeatedly averaged or computed together at the beginning and end of muting, so that the output data can be effectively prevented from showing a sudden and excessive change in signal amplitude.

Further, in the arrangement shown in FIG. 10, the data selector 53 may be arranged to produce the data supplied to the terminal S thereof as desired even on some occasions other than the start and end of muting. For example, in the event of receipt of several consecutive data of some relatively high error rate that does not require muting, this arrangement can prevent any excessive change from occurring in signal amplitude as a result of release of a previous value holding action.

What is claimed is:

1. A data processing device for processing data including a first data sequence indicative of the amplitude of an information signal and a second data sequence having each data thereof arranged to show the error rate of each corresponding data of the first data sequence, comprising:
   (a) detecting means using each data of said second data sequence for detecting that a number of data of the first data sequence more than a predetermined number consecutively have high error rates;
   (b) generating means for generating, in response to an output of said detecting means, data of values $1/a^k$ (wherein "k" represents an integer between 1 and "n", "a" a real number larger than 1 and "n" an integer at least 2) of a data of the first data sequence which has a low error rate and is located before or after the consecutive high error rate data within the first data sequence; and
   (c) muting means for muting the information signal by using data generated by said generating means.

2. A device according to claim 1, wherein said muting means includes means for substituting the data generated from said generating means for a part of said high error rate data of the first data sequence.

3. A device according to claim 1, wherein said muting means includes means for substituting the data generated from said generating means for data of the first data sequence received immediately after said high error rate data of the first data sequence.

4. A device according to claim 1, wherein said generating means includes means for shifting each bit of the data of the first data sequence toward a lower place.

5. A device according to claim 1, wherein said generating means includes computing means for producing data obtained by mixing two input data in the ratio of $(a-1)$ to 1.

6. A data processing device for processing data including a first data sequence indicative of the amplitude of an information signal and a second data sequence having each data thereof arranged to show the error rate of each corresponding data of the first data sequence, comprising:
   (a) detecting means using each data of said second data sequence for detecting that a number of data of the first data sequence more than a predetermined number consecutively have high error rates; and
   (b) generating means f or generating, one after another, in response to an output of said detecting means, data of values $1/a$, $1/a^2$, --- and $1/a^k$ (wherein "k" represents an integer at least 2 and "a" a real number larger than 1) of a low error rate data of the first data sequence received immediately before the data of the first data sequence having consecutively high error rates.

7. A device according to claim 6, wherein said generating means includes a shifting circuit arranged to generate data obtained by shifting each bit of said data received immediately before toward a lower place one after another.

8. A device according to claim 7, wherein said shifting circuit is arranged to generate, one after another, data of values $1/a^k$, $1/a^{k-1}$, --- and $1/a$ of a data of the first data sequence following data of the first data sequence consecutively having high error rates.

9. A device according to claim 6, wherein said generating means includes a computing circuit which mixes two input data in the ratio of $(a-1)$ to 1, said computing circuit being arranged to have output data thereof supplied to a first input terminal thereof.

10. A device according to claim 9, wherein said computing circuit is arranged to receive at a second input terminal thereof data indicative of the amplitude of the information signal corresponding to zero.

11. A device according to claim 9, wherein said computing circuit is arranged to receive at a second input terminal thereof one of the first data sequence following said data of the first data sequence consecutively having high error rates.

12. A data processing device for processing data including a first data sequence indicative of the amplitude of an information signal and a second data sequence having each data thereof arranged to show the error rate of each corresponding data of the first data sequence, comprising:
   (a) first detecting means which uses each data of said second data sequence for detecting that a number of data of the first data sequence more than a predetermined number consecutively have high error rates;
   (b) second detecting means which uses each data of said second data sequence for detecting that a data of the first data sequence has a low error rate after detection by said first detecting means; and
   (c) generating means for generating, one after another, in response to an output of said second detecting means, data of values which are $1/a^k$, $1/a^{k-1}$, --- and $1/a$ (wherein "k" represents an integer at least 2 and "a" a real number larger than 1) of each data of the first data sequence.

13. A device according to claim 12, wherein said generating means includes a shifting circuit arranged to shift each bit of each data of the first data sequence toward a lower place.

14. A device according to claim 12, wherein said generating means includes a computing circuit which mixes first and second input data in the ratio of $(a-1)$ to 1, said computing circuit being arranged to receive its own output data as a first input thereof.

15. A data processing device for processing data including a first data sequence indicative of the amplitude of an information signal and a second data sequence having each data thereof arranged to show the error rate of each corresponding data of the first data sequence, comprising:
   (a) shifting means capable of shifting each bit of data of the first data sequence to a bit of a lower place; and
   (b) control means for controlling, by means of said second data sequence, the number of bits to be shifted by said shifting means.

16. A device according to claim 15, further comprising muting means which performs a data processing operation for muting the information signal by means of data obtained from said shifting means.

17. A device according to claim 15, wherein said control means is arranged to permit changing the number of bits to be shifted to 0, 1, 2, --- and "k" one after another, "k" being an integer at least 2.

18. A device according to claim 16, wherein said control means is arranged to permit changing the number of bits to be shifted to k, $k-1$, ---, 1 and 0 one after another, "k" being an integer at least 2.

19. A data processing device for processing data including a first data sequence indicative of the amplitude of an information signal and a second data sequence having each data thereof arranged to show the error rate of each corresponding data of the first data sequence, comprising:
(a) first means arranged to produce data obtained by computing two input data;
(b) second means arranged to supply predetermined data to said first means as one of said two input data;
(c) third means arranged to selectively produce the data of said first data sequence of an output data of said first means;
(d) fourth means arranged to delay an output data of said third means and, after that, to supply the delayed data to said first means as another input data thereof; and
(e) fifth means for controlling said third means by using the data of said second data sequence.

20. A data processing device for processing data including a first data sequence indicative of the amplitude of an information signal and a second data sequence having each data thereof arranged to show the error rate of each corresponding data of the first data sequence, comprising:
(a) first means for producing data obtained by computing two input data thereof, said first means receiving the data of said first data sequence as one of input data thereof;
(b) second means arranged to selectively produce the data of said first data sequence or an output data of said first means;
(c) third means arranged to delay an output data of said second means and, after that, to supply the delayed output data of said second means to said first means as another input data thereof; and
(d) fourth means for controlling said third means using the data of said second data sequence.

21. A data processing device for processing data including a first data sequence indicative of the amplitude of an information signal and a second data sequence having each data thereof arranged to show the error rate of each corresponding data of the first data sequence, comprising:
(a) detecting means using each data of said second data sequence for detecting that a number of data of the first data sequence more than a predetermined number consecutively have high error rates; and
(b) generating means for generating, one after another, in response to an output of said detecting means, data of values $1-1/a$, $1-1/a^2$, --- and $1-1/a^k$ (wherein "k" represents an integer at least 2 and "a" a real number larger than 1) of each data of the first data sequence.

22. A device according to claim 21, wherein said generating means includes a first circuit which is arranged to produce, one after another, data of values $1/a$, $1/a^2$, --- and $1/a^k$ of input data.

* * * * *